United States Patent [19]

Tanaka et al.

[11] Patent Number: 4,911,771

[45] Date of Patent: Mar. 27, 1990

[54] LAMINATED PRINTED CIRCUIT BOARD AND PROCESS FOR ITS MANUFACTURE

[75] Inventors: Satoshi Tanaka; Masahiro Suzuki, both of Saitama, Japan

[73] Assignee: Junkosha Co., Ltd., Japan

[21] Appl. No.: 274,312

[22] Filed: Nov. 21, 1988

[30] Foreign Application Priority Data

Mar. 4, 1988 [JP] Japan ................................. 63-52244

[51] Int. Cl.$^4$ .............................................. B31B 1/60
[52] U.S. Cl. ..................................... 156/60; 156/228; 156/288; 156/306.3; 156/901; 264/104
[58] Field of Search ............... 174/68.5; 361/397, 398; 428/209, 457, 463, 901; 156/60, 228, 288, 306.3, 901; 264/104

[56] References Cited

U.S. PATENT DOCUMENTS

| | | | |
|---|---|---|---|
| 4,640,866 | 2/1987 | Suzuki | 428/901 |
| 4,680,220 | 7/1987 | Johnson | 428/901 |
| 4,772,509 | 9/1988 | Komada et al. | 428/251 |
| 4,781,969 | 11/1988 | Kobayashi et al. | 428/209 |
| 4,984,901 | 11/1988 | Hatakeyama et al. | 428/268 |

*Primary Examiner*—Patrick Ryan
*Attorney, Agent, or Firm*—Mortenson & Uebler

[57] ABSTRACT

A process is provided for making a laminated board useful in printed circuitry. The process involves laminating a metal layer to at least one side of a sheet of porous, expanded polytetrafluoroethylene using an adhesive followed by compressing the polytetrafluoroethylene sheet to increase its density. The metal layer may be a metal foil or it may comprise electrical circuitry. Also provided are printed circuit boards produced by the aforesaid process.

4 Claims, 1 Drawing Sheet

LAMINATED PRINTED CIRCUIT BOARD AND PROCESS FOR ITS MANUFACTURE

BACKGROUND OF THE INVENTION

The present invention relates to a laminated board which includes a layer of porous, expanded polytetrafluoroethylene (E-PTFE).

Regarding printed circuit boards using E-PTFE sheets of this type, the present inventors have disclosed the concept of lamination in Japanese Laid-Open Model Application (Kokai) No. 62-49277 and Japanese Laid-Open Utility Model Application (Kokai) No. 62-65879). In those applications, however, the porous material was used "as is". As a result, great care and skill were required for the working of the material, and the electrical characteristics tended to be unpredictable.

The present invention was developed in order to solve the abovementioned problems encountered in prior technology. An object of the present invention is to provide, with greater efficiency, a laminated board for printed circuit board use which has stable and predictable electrical characteristics and which does not require great skill to manufacture.

SUMMARY OF THE INVENTION

A process is provided for making a board useful in printed circuitry comprising laminating a metal layer to at least one side of a sheet of porous, expanded polytetrafluoroethylene (E-PTFE) with an adhesive, followed by compressing the E-PTFE sheet to increase its density. The metal preferably is copper in the form of a metal foil or an electrical circuit. Also provided is a printed circuit board comprising a metal layer adhesively bonded to a compressed sheet of porous, expanded E-PTFE.

DETAILED DESCRIPTION OF THE INVENTION AND PREFERRED EMBODIMENTS WITH REFERENCE TO THE DRAWINGS

A process is provided for making a laminated board useful in printed circuitry. The process involves laminating a metal layer to at least one side of a sheet of porous, expanded polytetrafluoroethylene using an adhesive followed by compressing the polytetrafluoroethylene sheet to increase its density. The metal layer may be a metal foil or it may comprise electrical circuitry. Also provided are printed circuit boards produced by the aforesaid process.

According to one embodiment of the present invention, a laminated board is formed by (a) applying an adhesive resin and a metal foil onto at least one surface of an E-PTFE sheet, and (b) compressing the E-PTFE sheet following the application of the adhesive resin and metal foil. In another embodiment, a laminated board is formed by (a) adhesively installing circuits on at least one surface of an E-PTFE sheet, and (b) compressing the E-PTFE sheet following the installation of the aforementioned circuits.

In the first embodiment of the present invention, wherein a laminated board is formed by applying an adhesive resin and a metal foil on at least one surface of an E-PTFE sheet, and then compressing the E-PTFE sheet, the adhesive resin penetrates into and is incorporated into the fine pores of the E-PTFE sheet so that the adhesive resin forms an integral unit with the E-PTFE sheet, thus insuring that the E-PTFE sheet sufficiently bonds the metal foil via the adhesive to the E-PTFE sheet without any need for a surface treatment.

In the other embodiment of the present invention, wherein a laminated board is formed by adhesively installing circuits on at least one surface of an E-PTFE sheet, and then compressing the E-PTFE sheet, the porous structure of the E-PTFE sheet is compressed in conformance with the projections and indentations of the circuits, so that a smooth surface is formed in which the surface of the E-PTFE sheet and the surface of the circuits are in the same plane. As a result, the lamination is facilitated, the amount of adhesive required for said lamination is extremely small, there is no substantial formation of areas with locally large dielectric constants as a result of the adhesive, and the electrical characteristics are stabilized. Because the specific inductive capacity is relatively large in the vicinity of the projections which form the aforementioned circuits, the electric field is concentrated in the vicinity of the projections, the result of which is that cross-talk between the lines which make up the circuits can be substantially prevented.

FIGS. 1–4 show cross-sections of laminated boards constructed according to the respective embodiments of the present invention.

Figure 1:
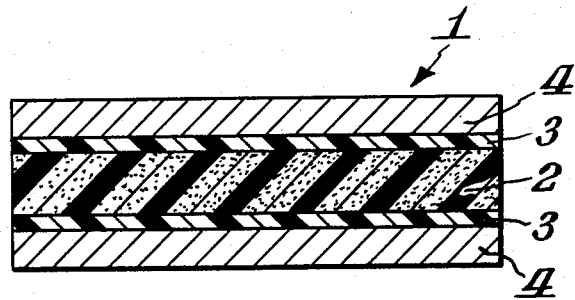
FIG. 1 is a cross-sectional view of one embodiment of a printed circuit board laminate according to the invention.
Figure 2:
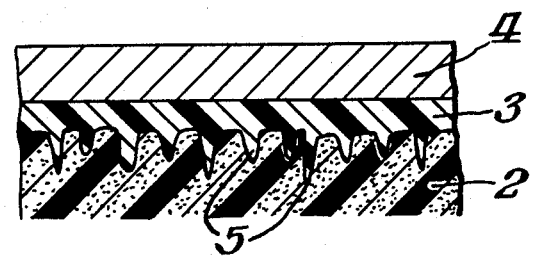
FIG. 2 is a magnified, exaggerated cross-sectional view of one adhesive layer of the laminate shown in FIG. 1.

The following is a description of the first embodiment of the present invention with reference to FIGS. 1 and 2.

Epoxy resin layers 3,3 used as adhesive resin layers, and sheets of a metal foil 4,4 are installed on both sides of an E-PTFE sheet 2. This assembly is then compressed at a press pressure of 10 to 40 kgf/cm$^2$ to form a laminated board 1. Accordingly, as is shown in exaggerated illustrative form in FIG. 2, the epoxy resin in the epoxy resin layers 3,3 penetrates into the fine pores 5 of the E-PTFE sheet 2, so that the resin forms an integral body with the sheet. Thus, the E-PTFE sheet 2 is sufficiently able to tightly bond the sheets of metal foil 4,4 via the epoxy resin layers 3,3 to the E-PTFE sheet. Furthermore, since the laminated board 1 is obtained by successively laminating the aforementioned E-PTFE sheet 2 and then compressing the resulting assembly, there is no need for a surface treatment process. Accordingly, efficient continuous production is possible.

Figure 3:
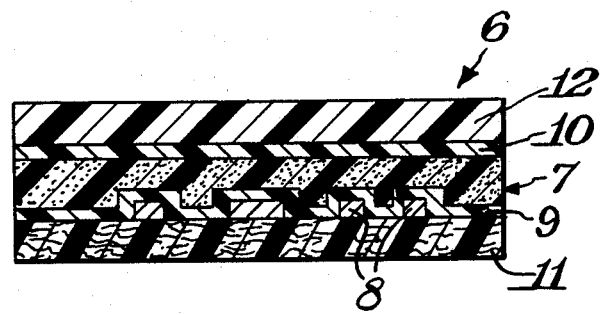
FIG. 3 is a cross-sectional view of another embodiment of a laminate according to the invention and FIG. 4 is a magnified view of the embodiment of FIG. 3 for explanatory purposes.
Figure 4:
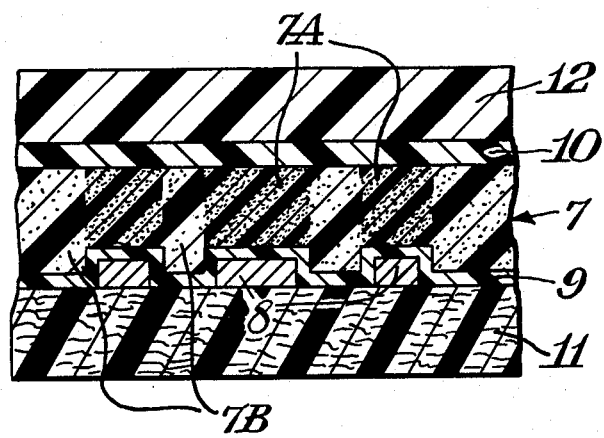

The following is a description of an example of lamination of a printed circuit board according to the second embodiment of the present invention, with reference to FIGS. 3 and 4.

An ethylene-tetrafluoroethylene (ETFE) resin layer 9, was applied as an adhesive resin layer, and E-PTFE sheet 7, an ETFE resin layer 10 and a polyimide resin sheet 12 were successively bonded to and laminated with a circuit layer which consisted of copper circuit 8 applied to a glass epoxy sheet 11. Afterward, a pressure of 4.3 kgf/cm² was applied for 10 minutes at a temperature of 310° C., and a pressure of 22.6 kgf/cm² was then applied for 20 minutes at the same temperature, producing a laminated board 6. As is shown in illustrative form in FIG. 4, the porous structure of the E-PTFE sheet 7 is compressed at a greater ratio in areas 7A which are in the vicinity of circuits 8 than in areas 7B where there are no circuits. As a result, the specific inductive capacity of the E-PTFE sheet 7 is greater in areas 7A which are in the vicinity of circuits than in the areas 7B where there are no circuits. Accordingly, the electric field of the circuit layer 8 is concentrated in the vicinity of the respective lines which make up the circuits, so that cross talk between lines can be substantially prevented. The ETFE resin layers 9, 10 penetrate into the fine pores of the E-PTFE sheet 7, so that the resin layers 9, 10 form an integral body with sheet 7. As a result, the E-PTFE sheet 7, the circuit layer 8, the glass epoxy sheet 11 and the polyimide resin sheet 12 are sufficiently bonded to each other, the production efficiency is improved, the dielectric constant is fixed and the electrical characteristics are stabilized, as in the aforementioned first embodiment.

In the laminated boards of both embodiments of the present invention, the thickness of the laminated board can be varied by adjusting the press pressure, and the specific inductive capacity and dielectric loss tangent of the E-PTFE sheet can be controlled to any desired values. By using a sufficiently large press pressure, it is possible to substantially eliminate the porous structure of the E-PTFE sheet, so that characteristics similar to those of a solid polytetrafluoroethylene resin (PTFE) sheet are obtained. In this case, however, an extremely thin laminated board, which cannot be obtained using an ordinary solid PTFE sheet, can be manufactured, and the bonding strength is also greatly improved.

As described above, in one embodiment of the present invention, a laminated board is formed by applying an adhesive resin and a metal foil on at least one surface of an E-PTFE sheet, and then compressing the E-PTFE sheet. As a result, the adhesive resin penetrates into the fine pores of the E-PTFE sheet so that the resin forms an integral body joined with the E-PTFE sheet. Accordingly, the E-PTFE sheet is sufficiently able to bond the aforementioned metal foil via the aforementioned adhesive resin. Because the manufacturing process requires no surface pretreatment process, the laminated board can be continuously produced at high efficiency.

In the other embodiment according to the present invention, a laminated board is formed by installing electrical circuits on an E-PTFE sheet and then compressing the E-PTFE sheet. A laminated board with a stable dielectric constant and stable electrical characteristics is obtained. Furthermore, there is no substantial surface irregularity, which is convenient for lamination. The porous structure of the E-PTFE sheet is compressed in conformance with the projections and indentations of the circuit layer, so that the E-PTFE sheet is bonded to the surface of the circuit layer. Because the E-PTFE sheet in circuit areas is compressed to a higher density, the specific inductive capacity is relatively larger in areas where circuits are formed. Accordingly, the electric field is concentrated in the vicinity of the aforementioned high-density areas, so that cross talk between the lines making up the circuits can be substantially prevented.

The two embodiments of the present invention are not limited to the examples described above. Various modifications are possible within the technical spirit of the invention, e.g., the resin material laminated with the E-PTFE sheet may be appropriately selected, or shielding layers may be added.

While the invention has been disclosed herein in connection with certain embodiments and detailed descriptions, it will be clear to one skilled in the art the modifications or variations of such details can be made without deviating from the gist of this invention, and such modifications or variations are considered to be within the scope of the claims hereinbelow.

What is claimed is:

1. A process for making a board useful in printed circuitry comprising laminating a metal layer to at least one side of a sheet of porous, expanded polytetrafluoroethylene (E-PTFE) with an adhesive, followed by compressing the E-PTFE sheet to increase its density.

2. The process of claim 1 wherein said metal is copper.

3. The process of claim 1 wherein said metal layer is a metal foil.

4. The process of claim 1 wherein said metal layer forms an electrical circuit.

* * * * *